United States Patent
Langhammer et al.

(10) Patent No.: US 6,400,290 B1
(45) Date of Patent: Jun. 4, 2002

(54) NORMALIZATION IMPLEMENTATION FOR A LOGMAP DECODER

(75) Inventors: Martin Langhammer, Dorset; Volker Mauer, Bucks, both of (GB)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/511,206

(22) Filed: Feb. 23, 2000

Related U.S. Application Data

(60) Provisional application No. 60/167,950, filed on Nov. 29, 1999.

(51) Int. Cl.[7] ............................................. H03M 13/00
(52) U.S. Cl. .......................... 341/94; 714/796; 714/795; 714/788
(58) Field of Search ................................. 714/796, 758, 714/755, 786; 375/227, 22, 322; 326/41, 37, 38, 39; 341/94

(56) References Cited

U.S. PATENT DOCUMENTS

| | | | |
|---|---|---|---|
| 3,473,160 A | * 10/1969 | Wahlstrom | 326/41 |
| 5,181,209 A | 1/1993 | Hagenauer et al. | 714/795 |
| 5,406,570 A | 4/1995 | Berrou et al. | 714/792 |
| 5,414,738 A | * 5/1995 | Bienz | 375/341 |
| 5,446,747 A | 8/1995 | Berrou | 714/788 |
| 5,537,444 A | 7/1996 | Nill et al. | 375/341 |
| 5,563,897 A | 10/1996 | Pyndiah et al. | 714/755 |
| 5,619,537 A | * 4/1997 | Altes | 375/322 |
| 5,689,195 A | * 11/1997 | Cliff et al. | 326/41 |
| 5,721,745 A | * 2/1998 | Hladik et al. | 714/755 |
| 5,721,746 A | 2/1998 | Hladik et al. | 714/792 |
| 5,721,754 A | * 2/1998 | Chen | 375/227 |
| 5,729,560 A | 3/1998 | Hagenauer et al. | 714/786 |
| 5,734,962 A | 3/1998 | Hladik et al. | 455/12.1 |
| 5,933,462 A | 8/1999 | Viterbi et al. | 375/341 |
| 6,088,387 A | * 7/2000 | Gelblum et al. | 375/222 |
| 6,182,261 B1 | * 1/2001 | Haller et al. | 714/758 |
| 6,192,501 B1 | * 2/2001 | Hladik et al. | 714/786 |
| 6,192,503 B1 | * 2/2001 | Chennakeshu et al. | 714/796 |
| 6,263,467 B1 | * 7/2001 | Hladik et al. | 714/755 |

FOREIGN PATENT DOCUMENTS

| | | |
|---|---|---|
| FR | 2 753 026 | 3/1988 |
| FR | 2 675 970 | 10/1992 |
| FR | 2 753 025 | 3/1998 |
| WO | WO96/24999 | 8/1996 |
| WO | WO97/38495 | 10/1997 |

OTHER PUBLICATIONS

L. Bahl et al., "Optimal Decoding of Linear Codes for Minimizing Symbol Error Rate". IEEE Transactions on Information Theory, vol. IT–20, No. 2, pp. 284–287, Mar. 1974.

(List continued on next page.)

*Primary Examiner*—Peguy JeanPierre
*Assistant Examiner*—Jean Bruner JeanGlaude
(74) *Attorney, Agent, or Firm*—Fish & Neave; Robert R. Jackson; Khue V. Hoang

(57) ABSTRACT

A programmable logic device can be programmed to configure its logic elements to approximate the normalization of probability values used in the operation of logMAP decoders, thereby significantly reducing the amount of logic resources required in the normalization procedure without significantly degrading performance. In the first preferred embodiment, normalization is achieved by approximating the normalization value by calculating an approximate normalization value which is then deducted from all α values in the trellis at any time. This is done by logically ANDing all α input probability values with the NOT of their own MSBs. The resulting outputs are then all bitwise ORed together, the output of which is the approximate normalization value. In another embodiment, the approximate normalization value is calculated using a fixed constant determinable at the outset of the logMAP decoder operation.

48 Claims, 7 Drawing Sheets

OTHER PUBLICATIONS

L. R. Rabiner, "A Tutorial on Hidden Markov Models and Selected Applications in Speech Recognition," Proceedings of the IEEE, vol. 77, No. 2, pp. 257–285, Feb. 1989.

C. Berrou et al., "Near Shannon Limit Error–Correcting Coding and Decoding: Turbo–Codes," Proceedings of the IEEE ICC '93, Geneva, Switzerland, pp. 1064–1070, May 1993.

P. Robertson et al., "Improving Decoder and Code Structure of Parallel Concantenated Recursive Systematic (Turbo) Codes," IEEE 3rd International Conference on Universal Personal Communications, San Diego, pp. 183–187, Sep./Oct. 1994.

J. Hagenauer, "Iterative ("Turbo") Decoding of Systematic Convolutional Codes with the MAP and SOVA Algorithms," pp. 21–29 (No Date).

S. Riedel, Y. V. Svirid, "Iterative ("Turbo") Decoding of Threshold Decodable Codes," European Transactions on Telecommunications and Related Technologies, ETT vol. 6, No. 5, Sep./Oct. 1995.

S. S. Pietrobon, "Implementation and Performance of a Serial MAP Decoder for use in an Iterative Turbo Decoder," IEEE International Symposium on Information Theory, Whistler, British Columbia, p. 471, Sep. 1995.

J. Hagenauer, "Iterative Decoding of Binary Block and Convolutional Codes," IEEE Transactions on Information Theory, vol. 42, No. 2, pp. 429–445, Mar. 1996.

C. Schlegel, Trellis Coding, IEEE Press, New York, 1997, Chapters 6 and 8, pp. 171–179 and 233–250.

G. Battail, "A Conceptual Framework for Understanding Turbo Codes," IEEE Journal on Selected Areas in Communications, vol. 16, No. 2, pp.245–254, Feb. 1998.

* cited by examiner

NORMALIZATION IMPLEMENTATION FOR A LOGMAP DECODER

CROSS REFERENCE TO RELATED APPLICATION

This claims the benefit of copending, commonly-assigned U.S. Provisional Patent Application No. 60/167,950, filed Nov. 29, 1999 which is hereby incorporated by reference herein in its entirety.

BACKGROUND OF THE INVENTION

This invention relates to a hardware implementation of the log Maximum A Posteriori (MAP) probability algorithm. More specifically, this invention relates to a programmable logic device that can be programmed to configure its logic elements to approximate the normalization of probability values used in the operation of logMAP decoders.

Programmable logic devices ("PLDs") typically include (1) many regions of programmable logic, and (2) programmable interconnection resources for selectively conveying signals to, from, and/or between those logic region's. Each logic region is programmable to perform any of several different, relatively simple logic functions. The interconnection resources are programmable to allow the logic regions to work together to perform much more complex logic functions than can be performed by any individual logic region. Examples of known PLDs are shown in U.S. Pat. Nos. 3,473,160, Re. 34,363, 5,689,195 and 5,909,126, and U.S. patent application Ser. No. 09/266,235, all of which are hereby incorporated by reference herein in their entireties.

One of the functions that can be implemented in a PLD is a log Maximum a Posteriori (logMAP) decoder, as used in turbo decoding. Turbo codes are a relatively recent coding and decoding technique that makes use of an iterative decoding scheme. Developed in, the early 1990s, turbo coding allows highly reliable data communication at signal-to-noise ratios very near the Shannon limit, which is defined as the minimum signal-to-noise ratio needed to communicate reliably over a given communication medium at a given spectral (bandwidth) efficiency. Turbo codes are described in a paper by C. Berrou entitled, "Near Shannon Limit Error Correcting Coding and Decoding: Turbo Codes," Proceedings of ICC '93, Geneva, Switzerland, pp. 1064–1070, May 1993, and the iterative decoding scheme is described in J. Hagenauer's "Iterative (Turbo) Decoding of Systematic Concatenated Codes with MAP and SOVA Algorithms," Proceedings of the ITG Conference on Source and Channel Coding, Frankfurt Germany, pp. 1–9, October 1994.

The fundamental concept of a logMAP decoder is that it is a machine that determines the state (path) metrics and branch metrics of a given encoder. State metrics are defined as the probability that any state in the trellis is reached at any given time, while the branch metric is defined as the probability that any particular branch was traversed at any given time in the trellis. A trellis is a term which describes a tree in which a branch not only bifurcates into two or more branches but also in which two or more branches can merge into one. A trellis diagram is an infinite replication of the state diagram for an encoder. The nodes (states) at one level in the trellis are reached from the node states of the previous level by transitioning through one branch, as determined by the state diagram.

In the present invention, the state and branch metrics are represented by $\alpha$, $\beta$, and $\gamma$. Alpha ($\alpha$) represents the forward state metric and is defined as the probability that any state will be reached during the forward path through the MAP decoder. Its counterpart, $\beta$, is the backward state metric and is defined as the probability that any state will be reached in a backward recursion through the MAP decoder. Gamma ($\gamma$) is the branch metric and is defined as the probability that any given branch of the trellis will be traversed at any given time. For practical implementation, the calculation can be calculated in the logarithmic domain. This means that all multiplication becomes addition and division becomes subtraction. The normalization of $\alpha$ values, normally a division operation in the MAP decoder, thus becomes a subtraction operation in the logMAP decoder.

Fixed point hardware implementation requires that the $\alpha$ and $\beta$ probabilities must be normalized to prevent overflow. One known method suggests that $\alpha$ values are normalized by deducting the largest $\alpha$ value from all $\alpha$ values generated in the trellis at any time. Typically, this is a multi-logic level operation, with the number of logic levels dependent on the constraint length of the logMAP decoder. In the first level of the comparison operation, pairs of $\alpha$ values are fed into a maximum value selection circuit where they are inputted into a comparator and a multiplexer (MUX). The MUX utilizes the output of the comparator to output the larger of the two $\alpha$s. These values are in turn paired and fed into another level of maximum value selection circuits which each outputs the larger of the two input values. This continues until the largest $\alpha$ has been isolated. The maximum $\alpha$ is then deducted from all the $\alpha$ values generated in the trellis. This means that the largest normalized value will be "0". Because the $\alpha$ values represent the probabilities of any state in the trellis being reached, this normalization also ensures that the sum of the probabilities of all states in the trellis being reached must approximate unity, where unity (or 1.0) is the ideal sum of all states after normalization. A floor is normally used to prevent underflow.

The primary drawback of this method, however, is that $N_s-1$ comparisons have to be made in order to isolate the largest $\alpha$, where $N_s=2^{(L-1)}$ and is defined as the number of states in the trellis of the logMAP decoder, and L, the constraint length, is defined as the number of memory elements used during the coding. Even when implemented as a tree, $\log_2 (N_s)$ levels of comparison are required in determining the largest $\alpha$. In programmable logic, each level of compare requires two levels of logic: one for the comparator, and one for the 2:1 multiplexer which selects the larger value. Thus the determination of the largest $\alpha$ often comprises the largest logic requirement in the logMAP decoder, as well as the largest component of the propagation delay in the critical path of the decoder.

It would be desirable to provide a method of normalization utilizing programmable logic devices in which the logic requirements are greatly reduced without degrading the performance of the logMAP decoder.

SUMMARY OF THE INVENTION

It is an object of this invention to provide a programmable logic device that can be programmed to configure its logic elements to approximate the normalization of probability values used in the operation of logMAP decoders, thereby significantly reducing the number of logic levels required in the normalization operation. Such reduction is projected to increase decoder speeds of three times over known processes, without significantly degrading accuracy. Indeed, the increased decoder speeds may allow for an increased number of iterations within the turbo decoder utilizing the logMAP decoder that may result in greater accuracy than known systems. Thus, this invention takes advantage of the fact that the logMAP and MAP decoders are found to work even if the state metrics are not precisely normalized after every calculation. Instead, an approximate normalization is used which greatly reduces the level of logic resources.

In a preferred embodiment, the α probabilities are approximately normalized by calculating an approximate normalization value which is then deducted from all α values in the trellis at any time. Because the approximate normalization value can only be positive, all negative α values are necessarily excluded from the comparison by logically ANDing the most significant bit (MSB) of each α with the NOT of its own MSB. The resulting bits are then all bitwise ORed together, thus approximating a single normalization value. This approximate normalization value is then fed into a subtraction circuitry which subtracts the approximate normalization value from all α values and outputs the desired normalized α values.

In the case of programmable logic devices, one logic level is what will fit into a four-input look-up table, or a new level of logic starts after a carry. Examples of functions using carries are adders, subtractors, or comparators. In the case of ASICs, a logic level is defined as starting after a carry.

The arrangement just described produces, in two logical levels of logic, the approximate normalization value. This is true regardless of the number of states involved in the operation of the logMAP decoder. In traditional logMAP decoders, such calculation of normalization would require at least six logic levels for a MAP turbo decoder of constraint length L=4. Increasingly higher number of logic levels are required for greater values of L—two additional logic levels for each additional L. Moreover, performing all of these functions in two logic levels reduces the use of the interconnection network, thereby speeding up this portion of the computation and allowing more iterations per time period.

In an alternative preferred embodiment, normalization is approximated by deducting a constant from the α values at every cycle, if any α exceeds 0. This is accomplished by ORing the MSBs of all the α values and inverting (negating) the result. The constant deducted from all the α values must be equal to or greater than twice the maximum value for γ, because in calculating state and branch metric values, it is known that $2|\max \gamma| \geq \alpha$ (where α is the maximum positive α). Ideally, the constant is set to a power of two, which simplifies the generation of the normalization value.

This alternative embodiment reduces the comparison operation to an $N_s$-input OR gate, where $N_s$ is the number of states in the trellis. Therefore, the comparison operation will only require one level of logic, although if pre-fabricated circuitry such as programmable logic devices are used to implement the structure, more actual physical levels may be required (this is generally true as $N_s$ becomes very large, e.g. $N_s$>32). For example, in this embodiment, programmable logic devices with four-input look up tables ("LUT") may be used to implement the logic. Using the LUT and CASCADE structures in known programmable logic devices (PLD) such as those available from the assignee hereof, up to thirty-two α values may be checked in parallel, with only two levels of logic, in a single comparison level.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout and in which.

DETAILED DESCRIPTION OF THE INVENTION

Figure 2:
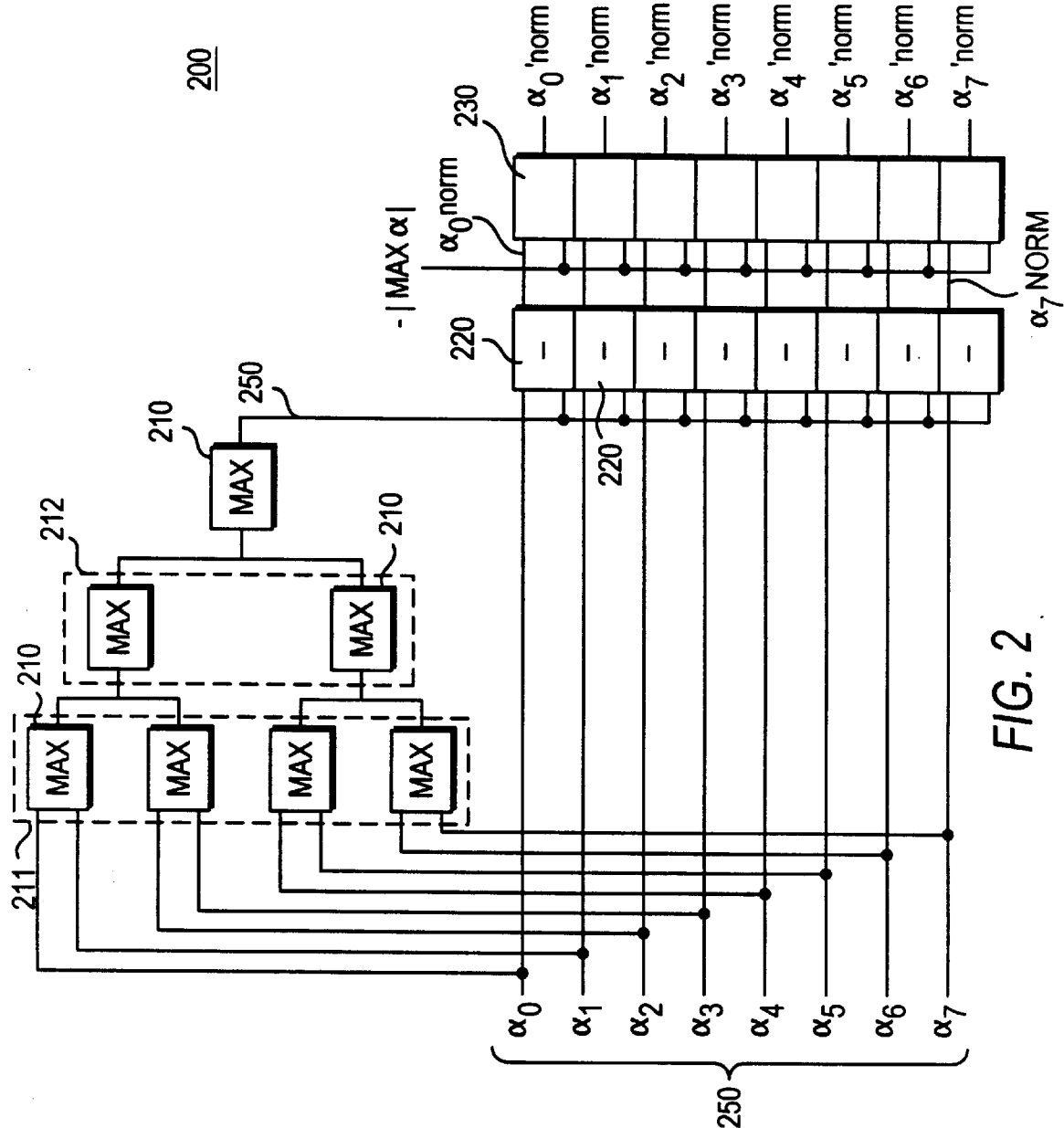
FIG. 2 is a simplified schematic block diagram of representative, illustrative interconnection resources detailing the comparison and normalization operations for an L=4 logMAP decoder using known methodology.

The following variables are used in describing the invention:

L—the constraint length of the MAP turbo decoder $N_s$—the number of states in the trellis of the logMAP decoder, also defined as $2^{(L-1)}$ α—the forward state metric, i.e., the probability of any given state being reached, calculated in the forward path through the logMAP decoder β—the backward state metric, i.e., the probability of any state being reached, calculated in the backward path through the logMAP decoder γ—the branch metric, i.e., the probability of any branch of the trellis being traversed at any given time in the trellis The working of the invention is described here below in: detail in the case of a representative logMAP decoder, with a constraint length of L=4 as shown in FIG. 2. The following discussion also teaches the present invention utilizing only the forward recursion path probabilities, denoted by α. However, those having ordinary skill in the art and access to the teachings herein will recognize that the teachings are equally applicable to the backward recursion path probabilities, β. Moreover, additional modifications, applications, and embodiments within the scope thereof in which the present invention may be applied, including but not limited to, logMAP decoders of varying lengths.

Figure 1:
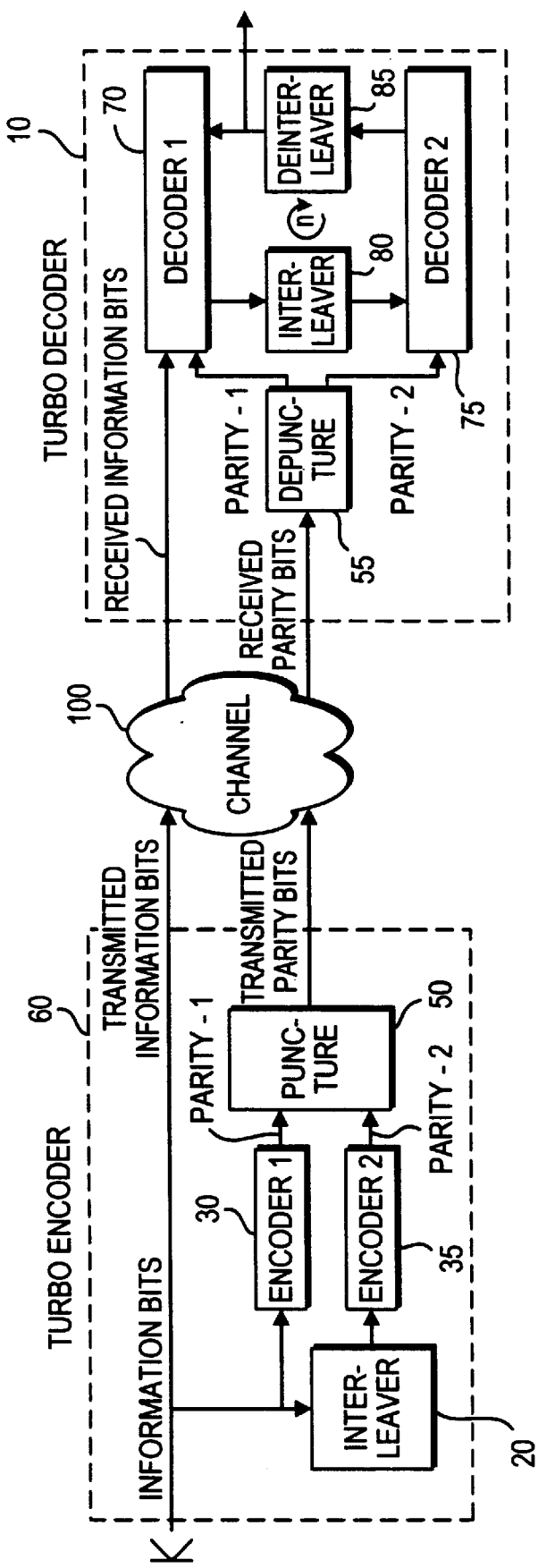
FIG. 1 is a simplified block diagram of an illustrative turbo encoder/decoder digital communication system in which the present invention can be used.

FIG. 1 is a simple block diagram representation of a turbo encoder/decoder communication system. A turbo encoder 60 is formed by a combination of two simple encoders 30 and 35. Assuming an information block of K information bits, the first encoder 30 receives as its input the K information bits in its original form. The same K information bits are fed through an interleaver 20 which permutes the information bits before inputting them into the second encoder 35. The two encoders 30 and 35 generate parity symbols from two simple recursive convolutional codes. These encoded information bit streams are then punctured by the puncturing mechanism 50 to save bandwidth.

The punctured information bit streams are transmitted through a noisy channel 100 before being received and depunctured 55 on the decoder side. After depuncturing, the received information bit streams are fed into the first decoder 70. A demodulator (not shown) delivers soft information on the received bit stream, i.e., it delivers probabilities of the received values. These probabilities can be interpreted as containing the received information bit value and the confidence value, which indicates how likely it is that this information bit is correct. A first decoder 70 then evaluates these probabilities and combines them with the first parity probabilities, thus refining the soft information so the confidence of individual bits being correct is maximized. The refined probabilities are fed into a second decoder 75 along with the information bits and the second parity bits, again producing enhanced soft information. After a predefined number of iterations (typically three to six) the decoding process is completed, and the soft decision values are available at the output.

When data is exchanged between the two decoders, the soft values are reordered to match the interleaving structure. This is done with the interleaver 80 and deinterleaver 85. When the second decoder 75 has finished, the next iteration is started, where again the first decoder 70 is activated, using the soft information from the previous decoding as well as the information bits and the first parity bits, and the second decoder 75 is activated as previously discussed.

The turbo decoder makes use of the log Maximum a Posteriori (logMAP) algorithm. The logMAP algorithm is computationally intensive, and much work has been done in improving its efficiency in practical implementations. This invention presents a hardware approach, capable of being implemented within a programmable logic device, to approximate the normalization values of forward and backward state metric values, $\alpha$ and $\gamma$, that may increase a logMAP decoder's throughput three times over the current art. This throughput may increase significantly as $N_s$ increases.

FIG. 2 shows a schematic block diagram illustrating current normalization techniques for a representative logMAP decoder 200 of constraint length, L=4. With $N_s = 2^{(L-1)} = 8$, there are then eight states 250, with eight corresponding state metrics, $\alpha_0$ through $\alpha_7$. In order to avoid overcrowding the diagram, maximum value selection circuits 210 are represented as single blocks and will be discussed in more detail in FIG. 3. Successive pairs of $\alpha$'s are fed into the first stage 211 of these maximum value selection circuits 210, whose outputs in turn are fed as pairs into another stage 212 of maximum value selection circuits 210 until a final maximum value is isolated and outputted at 250. This output, the isolated maximum $\alpha$, is fanned into a series of identical subtraction circuitry blocks 220, along with the individual $\alpha$ values, to perform the subtraction step. The outputs from these subtraction circuitry blocks are the normalized $\alpha$ values, $\alpha_{Nnorm} = \alpha_{0norm}$, $\alpha_{1norm}$, $\alpha_{2norm}$, etc.

Figure 3:
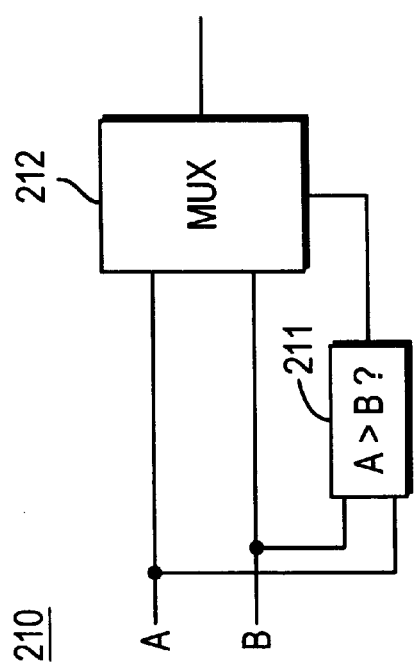
FIG. 3 is a simplified schematic block diagram of representative, illustrative interconnection resources detailing a maximum value selection circuitry using known methodology.

FIG. 3 details a representative maximum selection circuit 210. Two inputs, A and B, are fed into a comparator 211 which compares the magnitudes of the inputs. The output is fed into a multiplexer (MUX) 212 along with the original inputs A and B. The MUX then outputs the larger of the two inputs, A and B, based on the output of the comparator.

It is apparent from FIG. 2 that a logMAP decoder with constraint length L=4 and eight states requires three levels of comparison in order to isolate the largest $\alpha$ appropriate for normalization. Because each level of comparison requires two levels of logic, one for the comparator and one for the 2:1 multiplexer which selects the larger value, six total levels of comparison logic are required. Using this method of normalization, the number of required comparison logic levels increases as the constraint length increases: L=5 requires eight logic levels; L=6 requires ten; L=7 requires twelve; and so on. Note that generally, two additional logic levels are required to complete the normalization operation: one for the subtraction operation, and one for the underflow check operation.

Figure 4:
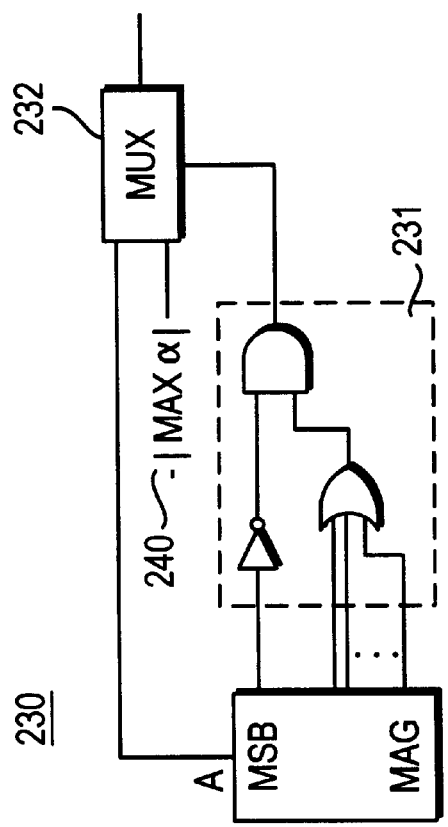
FIG. 4 is a simplified schematic block diagram of representative, illustrative interconnection resources detailing underflow check circuitry.

FIG. 4 details an underflow check circuitry 230. The purpose of the underflow check is to prevent the $\alpha$ values from negatively saturating during normalization. Because the $\alpha$ value representations are bit-limited, it may occur that the subtraction circuit will result in a negative value too large to represented by the available bits. Instead, the outputted value will "wrap around" and be outputted as a positive number. In these circumstances, the underflow circuit approximates the true value by outputting the maximum negative $\alpha$ $(-|\max \alpha|)$ 240 allowable for the number of bits available.

FIG. 4 checks for underflow by determining first if the $\alpha_{norm}$ output, represented as input A, is positive. This is done in function 231 by inverting the MSB of input A and ANDing it with the logical OR of the magnitude bits. If underflow has occurred and the output of the function 231 is high, the MUX 232 will output the maximum negative $\alpha$ as the normalized $\alpha$ output. If input A is not greater than zero, the function 231 outputs a low which in turn causes the MUX 232 to output. value A as the normalized $\alpha$ value. For example, if $\alpha_{0norm}$ is a positive value, $\alpha'_{0norm} = -|\max \alpha|$. If, however, $\alpha_{0norm}$ is negative, $\alpha'_{0norm} = \alpha_{0norm}$. As the function 231 uses no carries, the underflow check only requires one logic level. The underflow circuitry may be incorporated in all embodiments of this invention.

Figure 5:
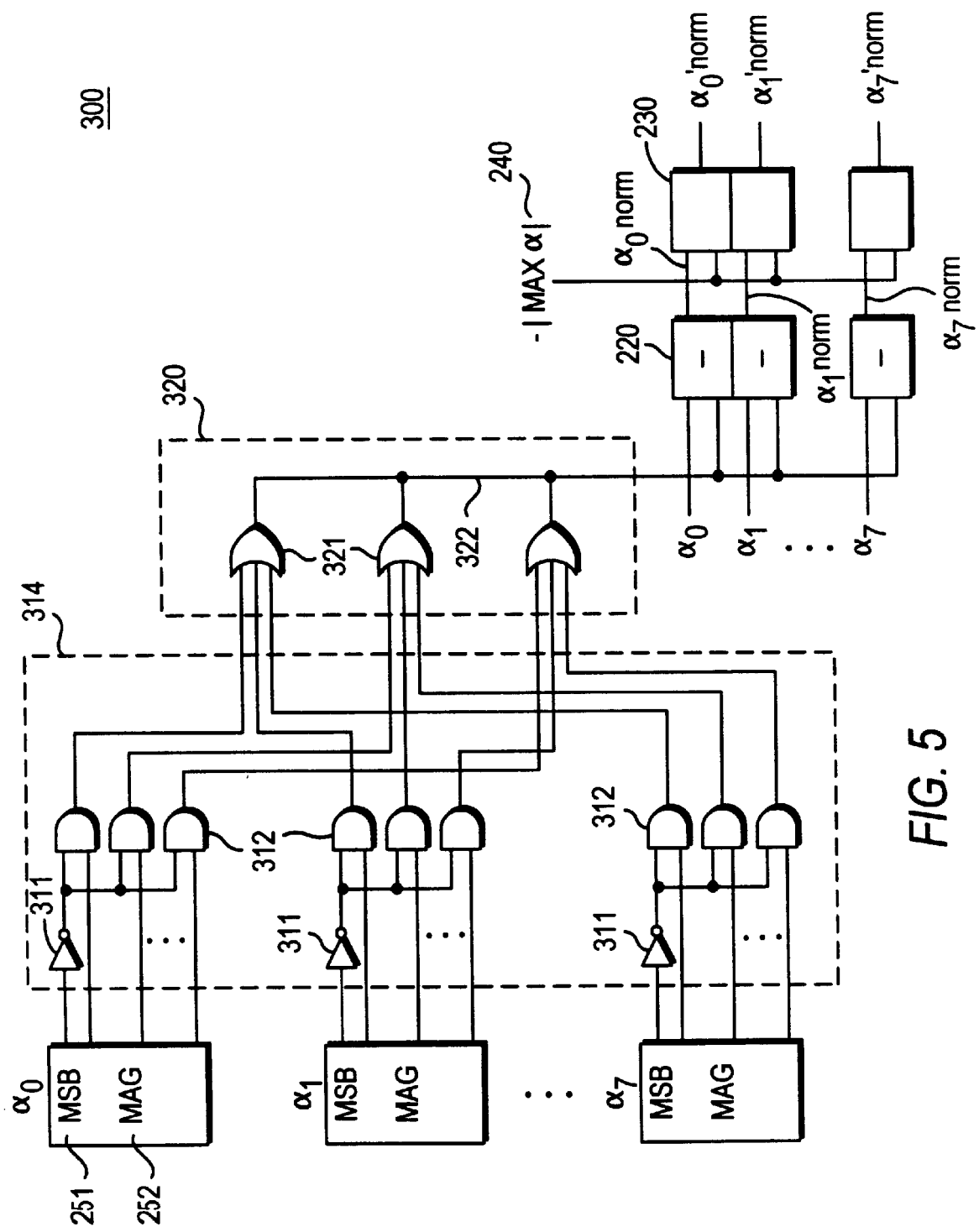
FIG. 5 is a simplified schematic block diagram of representative, illustrative programmable logic and related circuitry detailing the normalization approximation for an L=4 logMAP decoder in accordance with the preferred embodiment of the present invention.

FIG. 5 illustrates the first preferred embodiment 300 of the invention. This method approximates the normalization value by calculating an approximate normalization value which is then deducted from all $\alpha$ values in the trellis at any time. Preferably, the $\alpha$ probability values are in two's complement form with a sign bit 251 and magnitude bits 252, where the most significant bit (MSB) is the sign bit. The approximate normalization value can only be positive, therefore all negative $\alpha$ values should be excluded from the comparison. This is accomplished in the first stage 310 by logically ANDing 312 each bit of each $\alpha$ with the NOT 311 of its own MSB. The resulting values are then all bitwise ORed 321 together in the second stage 320. More precisely, inverting the sign of any negative $\alpha$ and ANDing it with its own bits will result in a "0" value for that $\alpha$ while inverting the sign of a positive $\alpha$ and ANDing it with itself will allow the value to pass. The bitwise ORing 320 then approximates and outputs at 322 the largest $\alpha$ which is then fanned into a series of identical subtraction circuitry blocks 220, along with the individual $\alpha$ values, to determine the normalized $\alpha$ outputs, $\alpha_{Nnorm}$. Each normalized output is then fed into an underflow check circuitry 230 to determine and correct for underflow as previously discussed. The underflow check circuitry outputs checked values, $\alpha'_{Nnorm}$.

Figure 6:
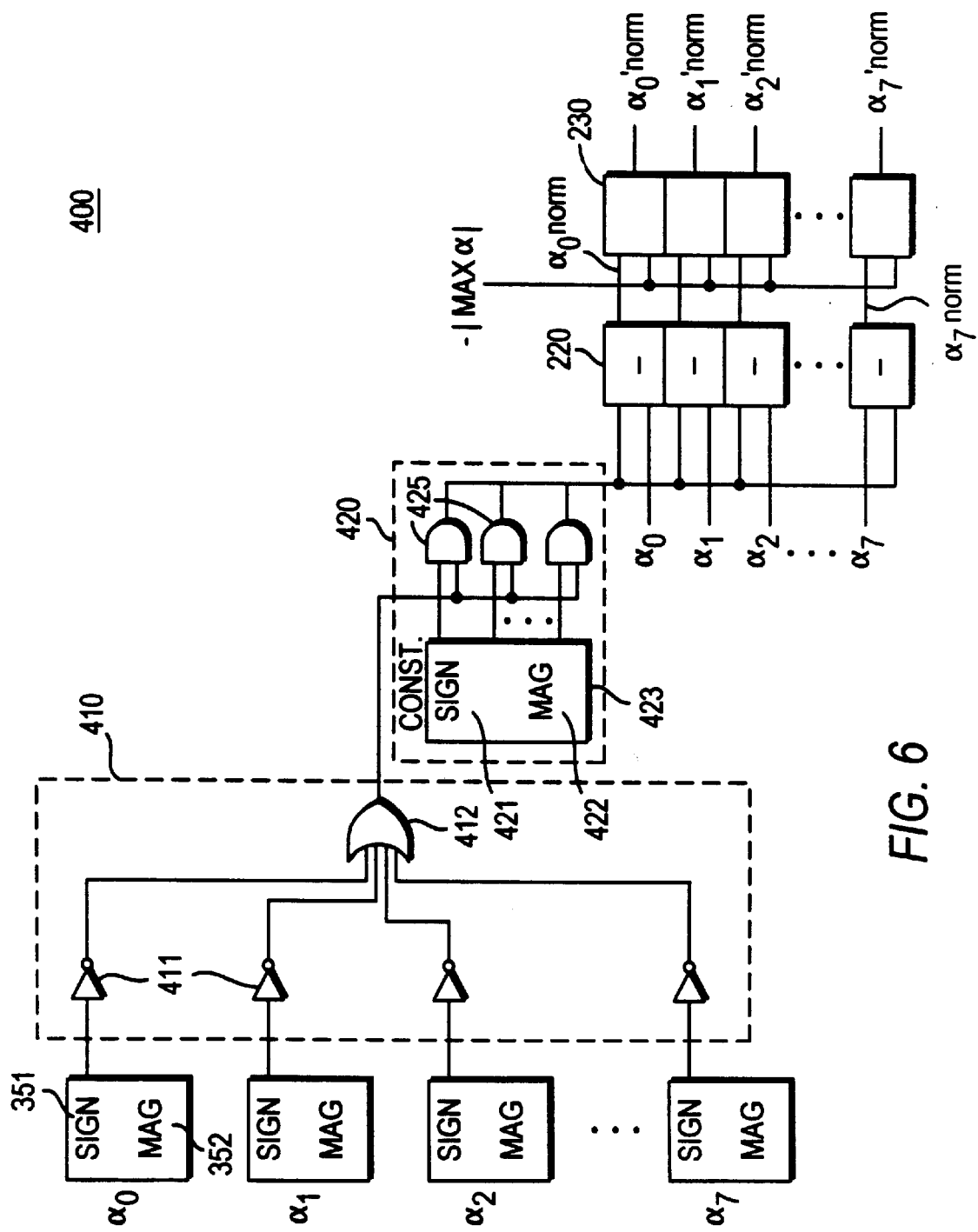
FIG. 6 is a simplified schematic block diagram of representative, illustrative programmable logic and related circuitry detailing the normalization approximation for an L=4 logMAP decoder in accordance with the alternative preferred embodiment of the present invention.

FIG. 6 is an alternative preferred embodiment of the invention 400. This method approximates the normalization by deducting a constant from the $\alpha$ values at every cycle, if $\alpha$ exceeds zero. This may be accomplished in the first stage 410 by inverting at 411 all the sign bits of the $\alpha$ values and ORing the result at 412. Preferably, the $\alpha$ values are in two's complement form with a sign bit 251 and magnitude bits 252, where the most significant bit (MSB) is the sign bit. The MSB 251 of each α is logically inverted through NOT gates 411 and the outputs are logically ORed together at 412. The output of OR gate 412 is then ANDed at 425 with the pre-determined constant 423 in the second stage 420. The pre-determined constant 423 is a positive valued two's complement number with a sign bit 421 and magnitude bits 422, where the MSB is the sign bit 421. If any of the α values are positive, the logical inversion of its sign bit will pass a 'high' or '1' to the OR gate which in turn will output a 'high'. The logical 'high' fed into the AND gate will then allow the constant to pass and thus be deducted from the original α's to yield the normalized α's. As with the first preferred embodiment, these normalized outputs are fed into an underflow check circuitry 230 to determine and correct for underflow as previously discussed. The underflow check circuitry outputs checked values, $\alpha'_{Nnorm}$.

The pre-determined constant 423 is preferably set to be equal to or greater than twice the maximum value of γ. Recalling that γ is a branch metric defined as the probability that any given branch of the trellis is traversed at any given time in the trellis, a constant of at least twice such value must be deducted from α because it is known that the largest positive α value is only equal to or less than twice the maximum γ value. In other words, $2|\max \gamma| \geq \alpha$ (where α is the maximum positive α). Ideally, the normalization constant is set to a power of 2 which greatly simplifies the generation of the normalization value. This embodiment reduces the generation operation to a single level, $N_s$-input, OR gate.

It is understood that utilizing an approximated normalization value may result in minor tradeoffs in accuracy. However, it is a characteristic of the present invention that the significant reduction of logic required in calculating the normalization values yields an increase in the speed and efficiency of the decoder, thus allowing a greater number of iterations to be performed in the same amount of time. Because the MAP turbo decoder utilizes a recursive algorithm, increasing the number of iterations will increase the accuracy of the calculation. Thus, any tradeoffs in accuracy due to the present approximation techniques may be compensated or surpassed by the increase in efficiency.

Figure 7:
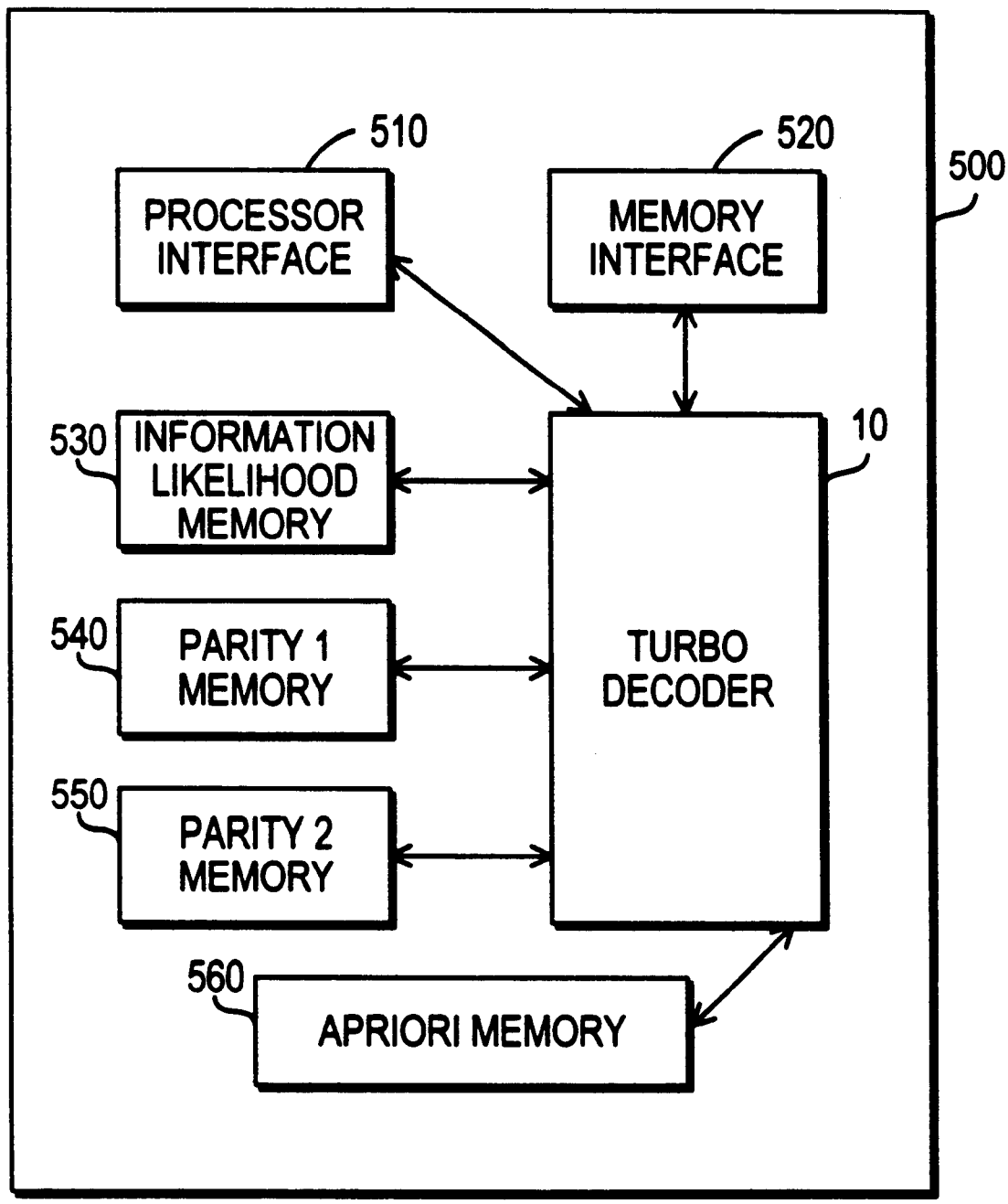
FIG. 7 is a simplified block diagram of programmable logic device employing a turbo decoder in accordance with the invention.

FIG. 7 illustrates a sample programmable logic device 500 containing a turbo decoder 10 in accordance with this invention. In addition to the turbo decoder, one or more of the following components may be implemented within the PLD: information likelihood memory 530, parity-1 memory 540, parity-2 memory 550, a processor interface 510, a priori memory 560, and a memory interface 520. An example of a PLD capable of configuring these components is the APEX 20K PLD available from the assignee hereof. The turbo decoder core 10 can be used in a wide variety of applications, including but not limited to point-to-point digital communication systems. The turbo decoder core is also ideally compliant with the Universal Mobile Telecommunications System (UMTS) standard for Parallel Concantenated Convolutional Codes.

Figure 8:
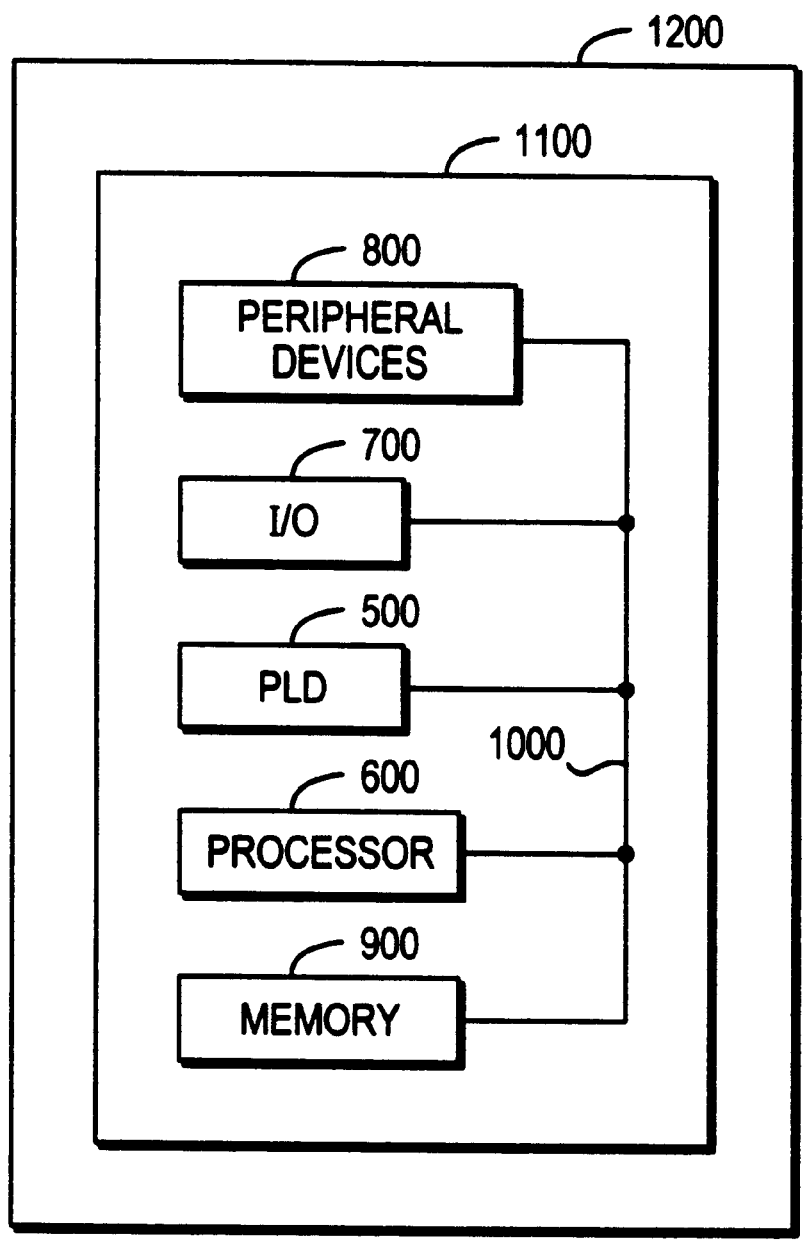
FIG. 8 is a simplified block diagram of an illustrative system employing a programmable logic device in accordance with the invention.

FIG. 8 illustrates a programmable logic device 500 of this invention in a data processing system 1300. Data processing system 1300 may include one or more of the following components: a processor 600; memory 900; I/O circuitry 700; and peripheral devices 800. These components are coupled together by a system bus 1000 and are populated on a circuit board 1100 which is contained in an end-user system 1200. In this example system, the processor 600 controls the operation of the turbo decoder 10 by setting up the parameters and initiating the decoding of each block. The processor writes the information and parity data into the appropriate memory, and reads the decoded information from system memory, in the form of logarithmic likelihood values.

System 1300 can be used in a wide variety of applications, such as computer networking, data networking, instrumentation, video processing, digital signal processing, or any other application where the advantage of using programmable or reprogrammable logic is desirable. Although as a general rule, programmable logic device 500 can be used to perform a variety of different logic functions—e.g., programmable logic device 500 can be configured as a processor or controller that works in cooperation with processor; as an arbiter for arbitrating access to a shared resource in system; or as an interface between processor and one of the other components in system—in accordance with the present invention, PLD 300 may also be configured as a turbo decoder for use in system 1300. It should be noted that system is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiment. It will also be understood that terms like "block" and "region" are also used only as generic, relative terms, and other terms may be used for generally similar circuitry. Alternatively, devices within the scope of this invention may have blocks of programmable logic that are not divided into regions.

Thus it is seen that a programmable logic device optimized to perform the approximate normalization operations within a logMAP decoder, and to perform such resulting in increased speed with little to no penalty in computational accuracy, has been provided. One skilled in the art will appreciate that the present invention can be practiced by other than the described embodiments, which are presented for purposes of illustration and not of limitation, and the present invention is limited only by the claims which follow.

What is claimed is:

1. A programmable logic device comprising:
    a plurality of regions of programmable logic, each having a plurality of input terminals and at least one output terminal, and each being programmable to selectively perform any of a plurality of logic functions on input signals applied to the input terminals to produce an output signal applied to the output terminal; and
    an interconnection network which is programmable to selectively connect the output terminal of substantially any of the regions to at least one of the input terminals of substantially any of the regions; wherein
        a plurality of regions in at least a subset of the plurality of regions of programmable logic comprises additional logic dedicated to the performance of a turbo decoder, the additional logic comprising a log maximum a posteriori decoder, the log maximum a posteriori decoder comprising:
            approximation circuitry for approximating the normalization of probability values in the log maximum a posteriori decoder that decodes signals encoded by a turbo encoder whose output is represented by a trellis diagram, the approximation circuitry comprising:
                a plurality of inputs, each of which provides a probability value having a corresponding sign bit and a plurality of magnitude bits;

extraction circuitry that extracts the sign bit from each of the inputs and that provides a corresponding output signal that indicates whether at least one of the sign bits is positive;

circuitry responsive to the output signal that provides an approximated probability value when at least one of the sign bits is positive;

subtraction circuitry that receives each of the probability values from the inputs and that subtracts the approximated probability value from each of the probability values to produce corresponding normalized probability values; and a plurality of outputs on which the normalized probability values are provided.

2. The programmable logic device of claim 1 wherein said approximated probability value is at least twice the maximum probability of a branch being traversed at any given time in said trellis.

3. The programmable logic device of claim 2 wherein said approximated probability value is a multiple of 2.

4. The programmable logic device of claim 1 further comprising:

underflow check circuitry for determining underflow status that receives each said normalized probability value from said subtraction circuitry and that outputs checked probability values wherein said checked probability values are normalized probability value if received normalized probability value is negative or a default constant if received normalized probability value is positive;

a plurality of outputs on which said checked probability values are provided.

5. The programmable logic device of claim 4 wherein underflow is checked by checking sign and magnitude bits separately, requiring no comparison.

6. The programmable logic device of claim 5 wherein said underflow check circuitry has only one logical level.

7. The programmable logic device of claim 4 wherein said default constant is the largest negative bit value for the maximum number of bits allotted to said normalized probability value.

8. The programmable logic device of claim 3 wherein the extraction circuitry that extracts the sign bits does not exceed one logical level.

9. The programmable logic device of claim 1 wherein said circuitry responsive to the output signal that provides an approximated probability value does not exceed one logical level.

10. The programmable logic devices of claim 1 wherein the extraction circuitry that extracts the sign bits does not exceed one logical level and the circuitry responsive to the output signal that provides an approximated probability value does not exceed one logical level.

11. A digital processing system comprising:

processing circuitry;

a memory coupled to said processing circuitry; and a programmable logic device as defined in claim 1 coupled to the processing circuitry and the memory.

12. A printed circuit board on which is mounted a programmable logic device as defined in claim 1.

13. The printed circuit board defined in claim 12 further comprising:

memory circuitry mounted on the printed circuit board and coupled to the programmable logic device.

14. The printed circuit board defined in claim 13 further comprising:

processing circuitry mounted on the printed circuit board and coupled to the memory circuitry.

15. A programmable logic device comprising:

a plurality of regions of programmable logic, each having a plurality of input terminals and at least one output terminal, and each being programmable to selectively perform any of a plurality of logic functions on input signals applied to the input terminals to produce an output signal applied to the output terminal; and an interconnection network which is programmable to selectively connect the output terminal of substantially any of the regions to at;least one of the input terminals of substantially any of the regions; wherein a plurality of regions in at least a subset of the plurality of regions of programmable logic comprises additional logic dedicated to the performance of a turbo decoder, the additional logic comprising a log maximum a posteriori decoder, the log maximum a posteriori decoder comprising:

approximation circuitry for approximating the normalization of probability values in the log maximum a posteriori decoder t hat decodes signals encoded by a turbo encoder whose output is represented by a trellis diagram, the approximation circuitry comprising:

a plurality of inputs, each of which provides a probability value having a corresponding sign bit and a plurality of magnitude bits;

extraction circuitry that extracts the sign bit and the magnitude bits from each of the inputs and that provides a corresponding plurality of output signals that preserve the bit-integrity of any positive input but zeros the sign bit and the magnitude bits of any negative input;

circuitry that receives the output signals of the extraction circuitry and outputs an approximated probability value;

subtraction circuitry that receives each the probability values from the inputs and that subtracts the approximated probability value from each the probability values to produce corresponding normalized probability values; and a plurality of outputs on which the normalized probability values are provided.

16. The programmable logic device of claim 15 further comprising:

underflow check circuitry for determining underflow status that receives each said normalized probability value from said subtraction circuitry and that outputs checked probability values wherein said checked probability values are normalized probability value if received normalized probability value is negative or a default constant if received normalized probability value is positive;

a plurality of outputs on which said checked probability values are provided.

17. The programmable logic device of claim 16 wherein underflow is checked by checking sign and magnitude bits separately, requiring no comparison.

18. The programmable logic device of claim 17 wherein said underflow check circuitry has only one logical level.

19. The programmable logic device of claim 15 wherein the extraction circuitry that extracts the sign bits does not exceed one logical level and the circuitry responsive to the output signal that provides an approximated probability value does not exceed one logical level.

20. The programmable logic device of claim 15 wherein the extraction circuitry that extracts the sign bits does not exceed one logical level.

21. The programmable logic device of claim 15 wherein said circuitry responsive to the output signal that provides an approximated probability value does not exceed one logical level.

22. A digital processing system comprising:
processing circuitry;
a memory coupled to said processing circuitry; and
a programmable logic device as defined in claim 15 coupled to the processing circuitry and the memory.

23. A printed circuit board on which is mounted a programmable logic device as defined in claim 15.

24. The printed circuit board defined in claim 23 further comprising:
memory circuitry mounted on the printed circuit board and coupled to the programmable logic device.

25. The printed circuit board defined in claim 24 further comprising:
processing circuitry mounted on the printed circuit board and coupled to the memory circuitry.

26. A log maximum a posteriori decoder comprising:
approximation circuitry for approximating the normalization of probability values in the log maximum a posteriori decoder that decodes signals encoded by a turbo encoder whose output is represented by a trellis diagram, the approximation circuitry comprising:
a plurality of inputs, each of which provides a probability value having a corresponding sign bit and a plurality of magnitude bits;
extraction circuitry that extracts the sign bit and the magnitude bits from each of the inputs and that provides a corresponding plurality of output signals that preserve the bit-integrity of any positive input but zeros the sign bit and the magnitude bits of any negative input;
circuitry that receives the output signals of the extraction circuitry and outputs an approximated probability value;
subtraction circuitry that receives each the probability values from the inputs and that subtracts the approximated probability value from each the probability values to produce corresponding normalized probability values; and
a plurality of outputs on which the normalized probability values are provided.

27. The log maximum a posteriori decoder of claim 26 further comprising:
underflow check circuitry for determining underflow status that: receives each the normalized probability value from the subtraction circuitry and that outputs checked probability values wherein the checked probability values are normalized probability value if received normalized probability value is negative or a default constant if received normalized probability value is positive;
a plurality of outputs on which the checked probability values are provided.

28. The log maximum a posteriori decoder of claim 27 wherein underflow is checked by checking sign and magnitude bits separately, requiring no comparison.

29. The log maximum a posteriori decoder of claim 28 wherein the underflow check circuitry has only one logical level.

30. The log maximum a posteriori decoder of claim 26 wherein the extraction circuitry that extracts the sign bits does not exceed one logical level.

31. The log maximum a posteriori decoder of claim 26 wherein the circuitry responsive to the output signal that provides an approximated probability value does not exceed one logical level.

32. The log maximum a posteriori decoder of claims 26 wherein the extraction circuitry that extracts the sign bits does not exceed one logical level and the circuitry responsive to the output signal that provides an approximated probability value does not exceed one logical level.

33. A log maximum a posteriori decoder comprising:
approximation circuitry for approximating the normalization of probability values in the log maximum a posteriori decoder that decodes signals encoded by a turbo encoder whose output is represented by a trellis diagram, the approximation circuitry comprising:
a plurality of inputs, each of which provides a probability value having a corresponding sign bit and a plurality of magnitude bits;
extraction circuitry that extracts the sign bit from each of the inputs and that provides a corresponding output signal that indicates whether at least one of the sign bits is positive;
circuitry responsive to the output signal that provides an approximated probability value when at least one of the sign bits is positive;
subtraction circuitry that receives each of the probability values from the inputs and that subtracts the approximated probability value from each of the probability values to produce corresponding normalized probability values; and
a plurality of outputs on which the normalized probability values are provided.

34. The log maximum a posteriori decoder of claim 33 wherein the approximated probability value is at least twice the maximum probability of a branch being traversed at any given time in the trellis.

35. The log maximum a posteriori decoder of claim 34 wherein the approximated probability value is a multiple of 2.

36. The log maximum a posteriori decoder of claim 33 further comprising:
underflow check circuitry for determining underflow status that receives each the normalized probability value from the subtraction circuitry and that outputs checked probability values wherein the checked probability values are normalized probability value if received normalized probability value is negative or a default constant if received normalized probability value is positive;
a plurality of outputs on which the checked probability values are provided.

37. The log maximum a posteriori decoder of claim 36 wherein underflow is checked by checking sign and magnitude bits separately, requiring no comparison.

38. The log maximum a posteriori decoder of claim 37 wherein the underflow check circuitry has only one logical level.

39. The log maximum a posteriori decoder of claim 36 wherein the default constant is the largest negative bit value for the maximum number of bits allotted to the normalized probability value.

40. The log maximum a posteriori decoder of claim 33 wherein the extraction circuitry that extracts the sign bits does not exceed one logical level and the circuitry responsive to the output signal that provides an approximated probability value does not exceed one logical level.

41. The log maximum a posteriori decoder of claim 33 wherein the circuitry responsive to the output signal that provides an approximated probability value does not exceed one logical level.

42. The log maximum a posteriori decoder of claim 33 wherein the extraction circuitry that extracts the sign bits does not exceed one logical level.

43. A method for approximating the normalization of probability values in a log maximum a posteriori decoder that decodes signals encoded by a turbo encoder whose output is represented by a trellis diagram, the method comprising the steps of:

inputting a plurality of inputs, each of which provides a probability value having a corresponding sign bit and a plurality of magnitude bits;

extracting the sign bit and the magnitude bits from each of the inputs and providing a corresponding plurality of output signals that preserve the bit-integrity of any positive input but zeros the sign bit and the magnitude bits of any negative input;

providing circuitry for receiving the output signals and outputting an approximated probability value;

subtracting the approximated probability value from each the probability values of the inputs to produce corresponding normalized probability values; and outputting the normalized probability values on a plurality of outputs.

44. The method of claim 43 further comprising the steps of:

determining underflow status using underflow check circuitry that receives each the normalized probability value from the subtraction circuitry and that outputs checked probability values wherein the checked probability values are normalized probability value if received normalized probability value is negative or, a default constant if received normalized probability value is positive;

outputting the checked probability values on a plurality of outputs.

45. The method of claim 44 wherein underflow is checked by checking sign and magnitude bits separately, requiring no comparison.

46. A method for approximating the normalization of probability values in a log maximum a posteriori decoder that decodes signals encoded by a turbo encoder whose output is represented by a trellis diagram, the method comprising the steps of:

inputting a plurality of inputs, each of which provides a probability value having a corresponding sign bit and a plurality of magnitude bits;

extracting the sign bit from each of the inputs and providing a corresponding output signal that indicates whether at least one of the sign bits is positive;

providing circuitry responsive to the output signal that provides an approximated probability value when at least one of the sign bits is positive;

subtracting each of the probability values from the inputs and subtracting the approximated probability value from each of the probability values to produce corresponding normalized probability values; and outputting the normalized probability values on a plurality of outputs.

47. The method of claim 46 further comprising the steps of:

determining underflow status using underflow check circuitry that receives each the normalized probability value from the subtraction circuitry and that outputs checked probability values wherein the checked probability values are normalized probability value if received normalized probability value is negative or a default constant if received normalized probability value is positive;

outputting the checked probability values on a plurality of outputs.

48. The method of claim 47 wherein underflow is checked by checking sign and magnitude bits separately, requiring no comparison.

* * * * *